United States Patent [19]

Renz

[11] Patent Number: 5,646,531
[45] Date of Patent: Jul. 8, 1997

[54] HIGH-FREQUENCY ANTENNA SYSTEM OF A DEVICE FOR NUCLEAR MAGNETIC RESONANCE

[75] Inventor: Wolfgang Renz, Erlangen, Germany

[73] Assignee: Siemens Aktiengesellschaft, München, Germany

[21] Appl. No.: 639,372

[22] Filed: Apr. 26, 1996

[30] Foreign Application Priority Data

Apr. 27, 1995 [DE] Germany .................. 195 15 586.6

[51] Int. Cl.$^6$ ................................................ G01V 3/00
[52] U.S. Cl. .................................... 324/318; 324/322
[58] Field of Search .................................. 324/318, 322, 324/314, 307, 309, 312; 128/653.5

[56] References Cited

U.S. PATENT DOCUMENTS

| | | | |
|---|---|---|---|
| 4,506,224 | 3/1985 | Krause | 324/319 |
| 4,799,016 | 1/1989 | Rezvani | 324/322 |
| 5,216,368 | 6/1993 | Leussler | 324/322 |
| 5,543,711 | 8/1996 | Srinivasan et al. | 324/322 |

FOREIGN PATENT DOCUMENTS

| | | |
|---|---|---|
| 0 073 375 | 3/1983 | European Pat. Off. . |
| 0 141 383 | 5/1985 | European Pat. Off. . |
| 0 273 484 | 7/1988 | European Pat. Off. . |
| 43 31 021 | 3/1995 | Germany . |
| 89/05115 | 6/1989 | WIPO . |

OTHER PUBLICATIONS

W. Duerr et al. "Hochfrequenzsysteme für dir Kernspintomografie", ntzArchiv, vol. 11,5 (1989), pp. 237–243.

Primary Examiner—Louis M. Arana
Attorney, Agent, or Firm—Kenyon & Kenyon

[57] ABSTRACT

The HF antenna system of a nuclear resonance device includes a plurality of antenna elements arranged one behind another in the direction of a longitudinal axis of the system, that are mutually at least largely magnetically decoupled and each connected to a transmitting and/or receiving device. To improve the axial field profile, the antenna elements are each cage-shaped with two end-located conductor rings, between which a plurality of conductor pieces extend at least approximately parallel to the longitudinal axis. Preferably the antenna system is composed of three or five antenna elements.

11 Claims, 3 Drawing Sheets

HIGH-FREQUENCY ANTENNA SYSTEM OF A DEVICE FOR NUCLEAR MAGNETIC RESONANCE

FIELD OF THE INVENTION

The present invention relates to a high-frequency antenna system of a device for nuclear magnetic resonance with a plurality of antenna elements, arranged one behind another in the direction of a longitudinal axis of the system, that are mutually at least largely magnetically decoupled and each connected to a transmitting and/or receiving device.

BACKGROUND INFORMATION

Devices for generating sectional images of an object under examination, in particular of a human body or body part, using nuclear magnetic resonance, are known in the art. In this context the body under examination is placed in a strong homogeneous magnetic field, called the background field, which causes in the body an alignment of the nuclear spin of atomic nuclei, especially of hydrogen atom nuclei (protons) bound to water. These nuclei are then excited, by means of high-frequency excitation pulses, into a precessional motion. After a corresponding excitation pulse has ended, the atomic nuclei precess at a frequency which depends on the strength of the background field, and then after a predetermined relaxation time swing back, as a result of their spin, into the preferred direction defined by the background field. From the spatial spin density or from the distribution of relaxation times, an image can be generated with reference to one layer of the body by computer and/or instrumental analysis of the integral high-frequency nuclear signals. The nuclear resonance signal detectable as a result of the precessional movement is allocated to its point of origin by the application of linear field gradients. For this purpose, suitable gradient fields are overlaid on the background field and controlled so that excitation of the nuclei occurs only in one layer that is to be imaged. Image depiction based on these physical effects is also known as nuclear spin tomography or nuclear magnetic resonance tomography.

A transmission (transmitting) device with at least one antenna is required for high-frequency (HF) excitation of the nuclear spin. As indicated by the publication "ntz-Archiv," vol. 11 (1989) no. 5, pages 237 to 243, or by European Application No. 0 073 375, a corresponding antenna can be configured as what is called a "whole-body resonator."

In corresponding devices for nuclear magnetic resonance, it can be advantageous to be able to switch over the field characteristic of a transmission antenna, in terms of location and magnitude, rapidly from one HF pulse to another HF pulse, i.e. during image recording. This requires an HF antenna system that is configured as an array of individual antenna elements which should be largely magnetically decoupled from one another.

A corresponding HF antenna system for reception (receive) is known from International Application No. 89/05115. It consists of a plurality of magnetically decoupled antenna elements, arranged next to one another, that in order to receive magnetic resonance signals are allocated to an examination region. The antenna elements are configured as rectangular conductor loops. For magnetic decoupling thereof, adjacent antenna elements overlap. The signals received by the individual antenna elements are combined into a common signal by taking into account the phase shifts between the individual signals due to the spatial orientation of the antenna elements.

A corresponding HF antenna system for reception purposes is indicated by European Application No. 0 273 484.

Another antenna system is shown in German Application No. 43 31 021, which illustrates an HF antenna system (array) that is made up of waveguide resonators or conductor loops that are decoupled from one another and that are supplied with separate transmission signals that are adjustable in phase and amplitude.

SUMMARY OF THE INVENTION

An object of the present invention is to configure the HF antenna system including the aforesaid features in such a way that the greatest possible transverse homogeneity, good utilization for examinations of the volume occupied by the antenna system, and decoupling of the individual elements from one another, can be attained simultaneously.

According to the present invention, the aforementioned object is achieved by the fact that the antenna elements are each cage-shaped with two end-located conductor rings, between which a plurality of conductor pieces extend approximately parallel to the longitudinal axis.

These features according to the present invention exploit the fact that antenna elements of cage-like shape in the form of "birdcage resonators" are particularly well suited for a whole-body antenna system because of their relatively steep field falloff, reinforced by end-ring currents, in the lengthwise direction. The comparatively steep field falloff thus yields the advantage of good utilization of the field area.

An HF antenna system of a device for nuclear magnetic resonance is based on an antenna array that is similar to that described in the aforementioned German Patent Application No. 43 31 021. In contrast, however, the antenna system according to the present invention is made up of N (where $N \geq 2$) cage-like antenna elements; for reasons of symmetry, three, five, seven, etc. individual antenna elements are advantageous. In general, a maximum of seven antenna elements are required for an antenna system with preferably three or five antenna elements are provided. Of course N can also be an even number such as 2 or 4. The individual antenna elements are arranged in a row one behind another along a longitudinal axis (for example the z axis of the nuclear resonance device), and in each case concentrically about that axis. An additional magnetic background field required to excite the nuclear spin also extends in the direction of that axis. The antenna system is distinguished by the fact that the transverse field characteristic (viewed with reference to that axis) of the individual antenna elements remains practically unchanged, and only the field characteristic along that axis varies.

DETAILED DESCRIPTION

Figure 1:
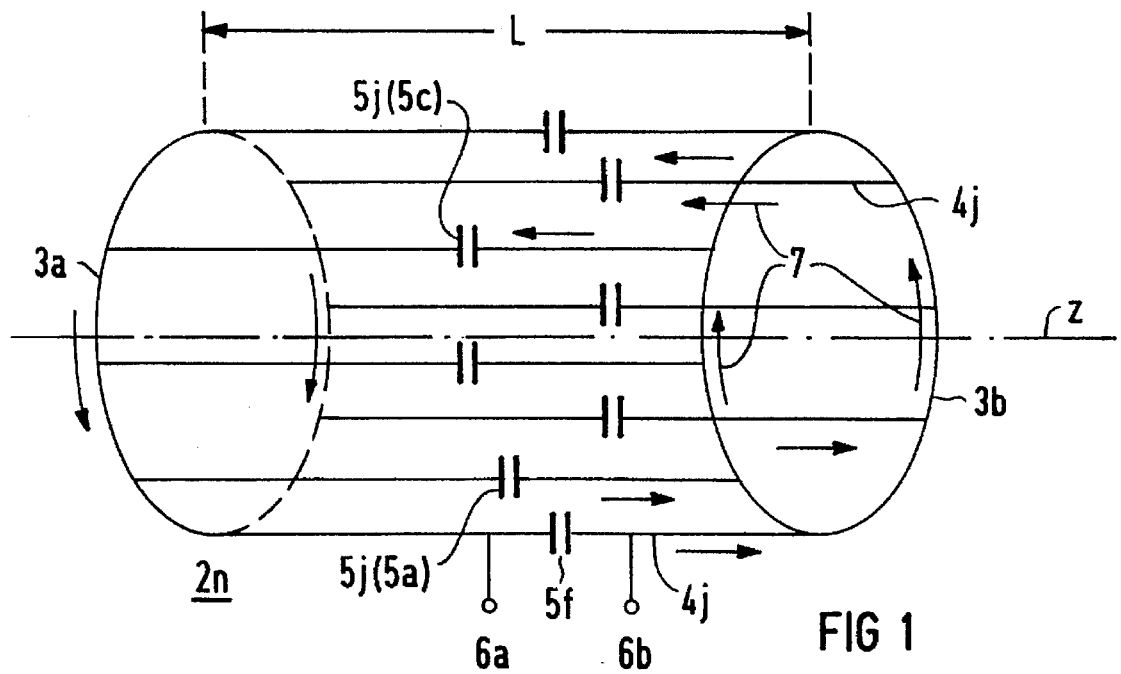
FIG. 1 shows the general construction of a cage-like antenna element of an antenna system according to the present invention.

An exemplary embodiment of an individual antenna element $2_n$ (where $1 \leq n \leq N$) of an HF antenna system according to the present invention is shown in FIG. 1. Such elements, are generally known in the art (see, for example, European Patent Application No. 0 141 383). The element $2_n$ includes two end-located conductor rings $3a$ and $3b$, spaced apart the length L of the element, that are arranged concentrically with an axis z. In this embodiment of the present invention, the conductor rings have a circular configuration, but they can also have a different shape, for example the shape of a regular polygon or an elliptical shape. Conductor rings $3a$ and $3b$ are each arranged in a plane perpendicular to the axis z. Extending between conductor rings $3a$ and $3b$ parallel to axis z are for example j=8 wire- or ribbon-shaped conductor pieces $4j$, which are distributed uniformly when viewed in the circumferential direction of antenna element $2_n$. A capacitor $5j$ is provided in each of the conductor pieces $4j$. An HF transmission device and/or reception device, known in the art and not depicted here, can, for example, be connected via one of these capacitors (e.g., capacitor $5f$) to connections $6a$ and $6b$. The capacitors can also, however, be located at other points on the antenna element, for example in the end-located conductor rings. Also indicated in the Figure, by arrows 7, are current flow directions of currents that can occur at the HF transmission mechanism during the operation of antenna element $2_n$.

Figure 2:
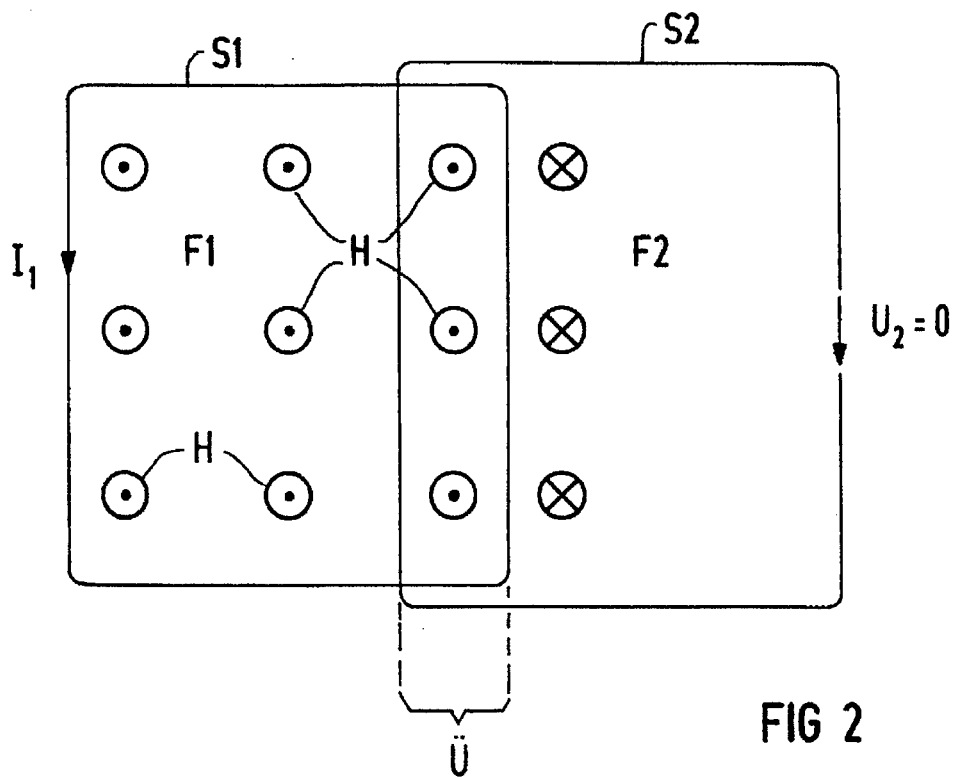
FIG. 2 shows two magnetically decoupled antenna loops according to the present invention.

In an Hf antenna system according to the present invention, a plurality of such cage-like antenna elements $2_n$ are arranged one behind another in the direction of a longitudinal axis (or the z axis) in such a way that they are at least largely magnetically decoupled from each other. FIG. 2 shows an essential principle to be taken as the foundation for such a decoupling, for two arbitrary loops S1 and S2 that border surfaces F1 and F2. Decoupling is achieved here by an overlap in an edge region ü of the loops, which corresponds to an end-located overlap region of adjacent cage-like antenna elements of the antenna system according to the present invention. Because of a current $I_1$ flowing in it, loop S1 generates a magnetic field H oriented perpendicular to the plane of the drawing, which also passes through surface F2 especially in overlap region ü. The magnetic fluxes in overlap region ü and in the remaining region of surface F2 are opposite and of equal magnitude. The result is that voltage $U_2$ induced in loop S2 becomes zero. Loops S1 and S2 are thus magnetically decoupled.

For corresponding decoupling of adjacent cage-shaped antenna elements of an antenna system according to the present invention, a corresponding overlap of mutually facing end regions of the antenna elements can preferably be provided, the axial extension of the overlap region being much less than the total length of each of the individual elements. By suitably varying the cage diameter, the diameter of the end rings, and the distance between the end rings and an HF shield surrounding them, and by means of the end ring shape, and in particular by means of the overlap length, both optimum antenna element decoupling and, when two antenna elements are excited simultaneously, a smooth field profile in the overlap region, can be achieved. A corresponding decoupling is possible not only with antenna elements operating in linearly polarized fashion, but also with antenna elements operating in circularly polarized fashion for the two orthogonal polarizations.

It is particularly simple to vary the axial overlap length if prefabricated antenna elements that are movable in the axial direction are used. Specifically, by relative movement of adjacent elements one antenna element can then be excited in accordance with the principle as shown in FIG. 2, and the element adjacent to it can be brought to zero voltage by axial displacement.

Figure 3:
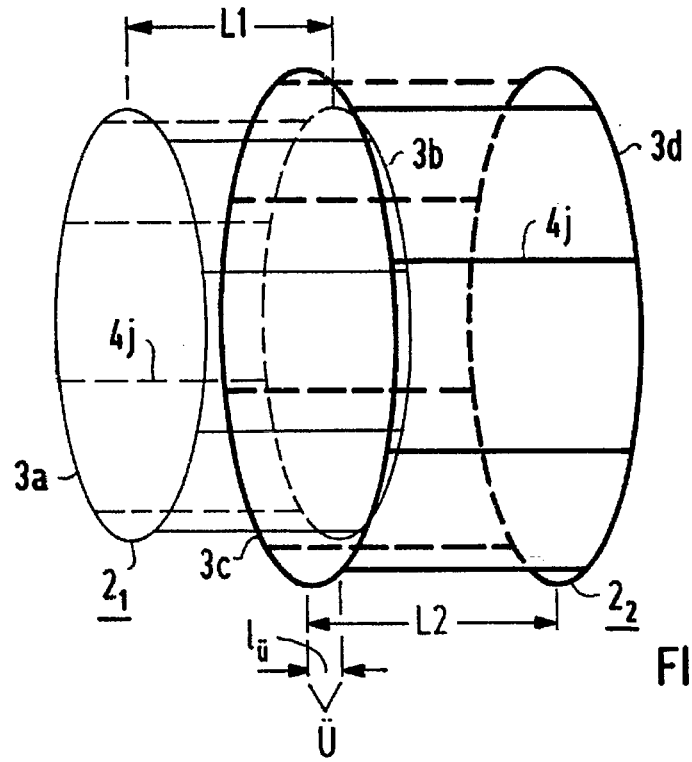
FIG. 3 shows two antenna elements magnetically decoupled by overlapping according to another embodiment of the present invention.

FIG. 3 shows another embodiment of the present invention with two adjacent antenna elements $2_n$ and $2_{n+1}$ (where $1 \leq n \leq N-1$). According to the embodiment shown in FIG. 3, only two elements $2_1$ and $2_2$ are depicted, although an HF antenna system according to the present invention generally has more elements, in particular, n=3 or n=5 elements. The two elements are arranged on at least one support tube (not shown) and are preferably displaceable relative to one another in the direction of the z-axis. The obvious choice for practical construction of a corresponding antenna system is an insulating support tube, on which the individual antenna elements, made for example of a copper foil, are arranged alternately on its inner and outer side. Diameter d1 of element $2_1$ is somewhat smaller than diameter d2 of element $2_2$, so that the two elements can overlap in a region ü. Each element has end-located conductor rings $3a$ and $3b$, and $3c$ and $3d$, as well as a plurality of axial conductor pieces $4j$ of predefined axial length L1 and L2. The lengths of the elements do not necessarily need to be the same. For example, they are approximately as great as the diameter of the end-located conductor rings of the respective element. The requirements as to field homogeneity of the individual antenna determine the exact lengths. Moreover, in this embodiment of the present invention as shown, the axial length $l_ü$ of the overlap region ü is approximately one-tenth the length L2 of element $2_2$.

Figure 4:
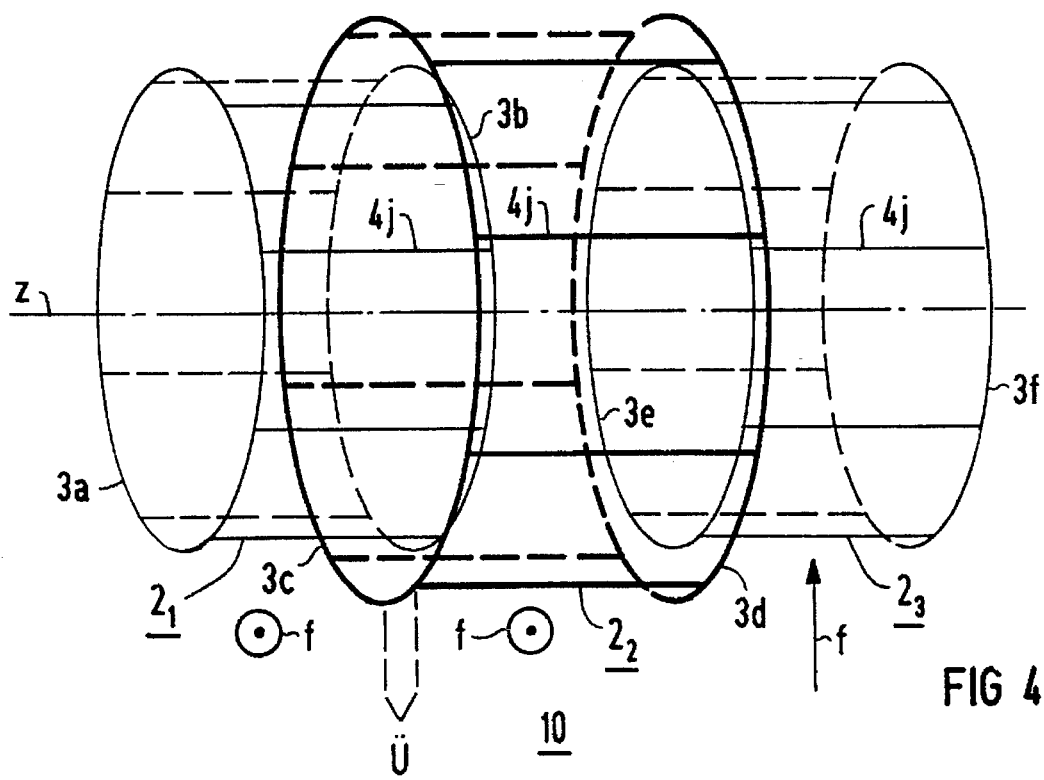
FIG. 4 shows three magnetically decoupled antenna elements for a linearly polarized HF field according to a third embodiment of the present invention.

Magnetic decoupling of adjacent cage-like antenna elements of an HF antenna system according to the present invention is not always attainable solely by means of a lateral overlap of those elements. Specifically, in antenna systems operating in linearly polarized fashion, decoupling of adjacent antenna elements can also be implemented by means of a field orientation of such elements that is rotated through 90°. Simultaneous application of both decoupling methods in the case of linear polarization, namely overlap and 90° rotation, allows complete decoupling of, for example, three successive antenna elements, as shown in FIG. 4. Two adjacent antenna elements $2_2$ and $2_3$ of an antenna system 10 comprising three antenna elements $2_1, 2_2,$ and $2_3$, are rotated 90° with respect to one another in terms of their field orientations, indicated in FIG. 4 by symbols f, and thus decoupled. Optionally, therefore, overlapping of these two antenna elements $2_2$ and $2_3$ in the region of their mutually facing end-located conductor rings $3d$ and $3e$ may even be omitted. On the other hand, antenna elements $2_1$ and $2_2$ are congruent in terms of field orientation f. By means of lateral overlapping of the elements $2_1$ and $2_2$ in an overlap region ü of their mutually facing end-located conductor rings $3b$ and $3c$, however, these elements are also decoupled. Elements $2_1$ and $2_3$ are also rotated 90° with respect to one another. Thus all three elements $2_1, 2_2,$ and $2_3$, with their end-located conductor rings $3a$ to $3f$, are decoupled from one another.

In a continuation of the sequential addition principle illustrated in FIG. 4, a first antenna element and a fifth antenna element could be easily decoupled from one another. In this case, however, due to the large axial spacing between these elements, the residual coupling is so small as to be negligible for a practical application.

In another antenna system (not shown) with three antenna elements in a symmetrical arrangement and operating in a linearly polarized fashion, the first element and the second element can be rotated 45° with respect to one another in terms of their field orientations, simultaneously overlapping in lateral regions. The axial overlap length $l_ü$ required here is somewhat greater than with congruent field orientation.

The second and third antenna elements overlap correspondingly, and are also rotated 45° in terms of their field orientations, specifically in such a way that the field orientations of the first and the third elements are rotated 90° with respect to each other. Thus, here again, all three elements are decoupled from one another, although somewhat greater overlap lengths $l_{ü}$ are required in overlap regions ü.

Figure 5:
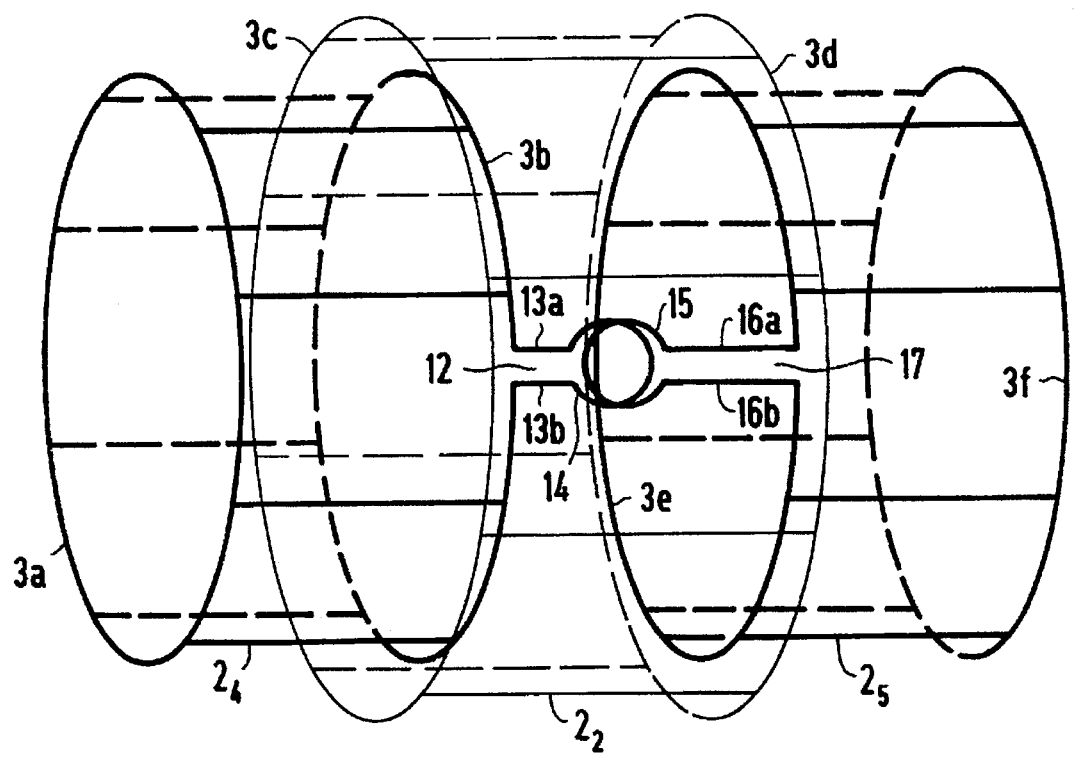
FIG. 5 shows three magnetically decoupled antenna elements with additional decoupling for a circularly polarized HF field according to yet another embodiment of the present invention.

With HF antenna systems according to the present invention operating in circularly polarized fashion, only decoupling by means of overlap in end-located conductor ring regions of the individual antenna elements is available as the decoupling method. If mutual decoupling of a first antenna element from a third element is not sufficient in this case due to their axial spacings, decoupling of these elements can be improved by means of one or more small additional decoupling loops. FIG. 5 shows an embodiment according to the present invention to illustrate such a principle. The antenna system, labeled generally as 11, comprises three antenna elements $2_4$, $2_2$, and $2_5$, the center antenna element $2_2$ being simply indicated with thin lines for the sake of clarity. In contrast to the embodiment of antenna element $2_1$ shown in FIGS. 3 and 4, antenna element $2_4$ has, in its end-located conductor ring 3b facing antenna element $2_5$, a joining point 12 at which two axial supply leads 13a and 13b are connected to an additional decoupling loop 14. This decoupling loop is located in the region of center antenna element $2_2$, preferably in the region of its center or of a corresponding plane of symmetry of the overall antenna system 11. Since supply leads 13a and 13b are preferably implemented coaxially between conductor ring 3b and decoupling loop 14 the field structure of the overall antenna system is, advantageously, not appreciably affected. Correspondingly, and symmetrically to the end-located conductor ring 3b of the first antenna element $2_4$ with its additional decoupling loop 14, end-located conductor ring 3e of antenna element $2_5$ is also equipped with a decoupling loop 15 and coaxial supply leads 16a and 16b at a joining point 17. Decoupling loop 15 at least largely overlaps decoupling loop 14. Of course, each of the outer antenna elements ($2_4$, $2_5$) can also have a plurality of such decoupling loops. The shape of these loops does not necessarily need to be the circular shape as shown in FIG. 5. Simple, straight, or curved conductor pieces are thus also possible as decoupling loops. These loops also do not necessarily need to overlap. Sufficient decoupling can also be achieved by an adjacent arrangement of such loops.

In the embodiments shown in FIGS. 1 and 3 through 5 of cage-like antenna elements of HF antenna systems according to the present invention, it was assumed that the end-located conductor rings are each arranged in a plane aligned perpendicular to longitudinal axis z. This makes it necessary, given a desired overlap of adjacent antenna elements, for the antenna elements to have different diameters, at least in the region of their overlapping end rings. For a corresponding implementation, either the adjacent antenna elements each delimit a cylindrical volume with a different diameter, or it is equally possible for them to describe substantially identical cylindrical volumes, and for only one of the elements to taper to a smaller diameter toward the overlap region.

Moreover, the conductor portions of an end-located conductor ring extending between adjacent axial conductor pieces also need not necessarily extend in a common plane. It is conceivable, for example, for at least some of the conductor portions joining adjacent axial conductor pieces to bulge outward in the direction of a desired overlap zone as a corresponding loop or a corresponding loop portion.

The additional decoupling loops 14 and 15 shown in FIG. 5 may be regarded as an embodiment of such bulging conductor portions.

What is claimed is:

1. A high-frequency antenna system for a nuclear magnetic resonance device, the high-frequency antenna system having a longitudinal axis, the high-frequency antenna system comprising:

a plurality of antenna elements arranged substantially coaxially about the longitudinal axis and including adjacent antenna elements, each of the adjacent antenna elements having a portion which does not overlap a portion of another adjacent antenna element, each of the plurality of antenna elements being cage-shaped and including two end-located conductor rings and a plurality of conductor members, wherein the plurality of conductor members are positioned substantially between the two end-located conductor rings, the conductor menders extending substantially parallel to the longitudinal axis.

2. The high-frequency antenna system according to claim 1, wherein the plurality of antenna elements includes three antenna elements.

3. The high-frequency antenna system according to claim 1, wherein the plurality of antenna elements includes five antenna elements.

4. The high-frequency antenna system according to claim 1, wherein the adjacent antenna elements overlap one another by a predefined length.

5. The high-frequency antenna system according to claim 4, wherein the adjacent antenna elements have different respective diameters in an overlap region of the end-located conductor rings.

6. The high-frequency antenna system according to claim 4, wherein some of the end-located conductor rings includes at least one conductor portion which bulges toward the longitudinal axis.

7. The high-frequency antenna system according to claim 6, wherein the plurality of antenna elements includes two outer elements and one center antenna element.

8. The high-frequency antenna system according to claim 7, further comprising at least one conductor loop being integrated with each of the adjacent end-located conductor rings of the two outer antenna elements, the conductor loops being arranged in a decoupling manner within the center antenna element.

9. The high-frequency antenna system according to claim 1, wherein each one of the plurality of antenna elements is displaceably positioned relative to a different one of the plurality of antenna elements along the longitudinal axis for adjusting a mutual decoupling of the adjacent antenna elements.

10. The high-frequency antenna system according to claim 1, wherein the adjacent antenna elements are rotated to generate magnetic fields with correspondingly rotated orientations, the adjacent antenna elements being rotated as viewed in a circumferential direction with respect to the longitudinal axis.

11. The high-frequency antenna system according to claim 1, wherein the plurality of antenna elements include first and second antenna elements being adjacent, the first antenna element having a first predetermined length in the direction of the longitudinal axis, the first predetermined length being different from a second predetermined length of the second antenna element.

\* \* \* \* \*